(12) United States Patent
Inaba et al.

(10) Patent No.: US 9,288,931 B2
(45) Date of Patent: Mar. 15, 2016

(54) COOLING SYSTEM AND DEVICE HOUSING APPARATUS USING THE SAME

(75) Inventors: Kenichi Inaba, Tokyo (JP); Minoru Yoshikawa, Tokyo (JP); Hitoshi Sakamoto, Tokyo (JP); Masaki Chiba, Tokyo (JP); Arihiro Matsunaga, Tokyo (JP)

(73) Assignee: NEC Corporation, Tokyo (JP)

( * ) Notice: Subject to any disclaimer, the term of this patent is extended or adjusted under 35 U.S.C. 154(b) by 240 days.

(21) Appl. No.: 14/131,230

(22) PCT Filed: Jul. 5, 2012

(86) PCT No.: PCT/JP2012/067762
§ 371 (c)(1),
(2), (4) Date: Jan. 7, 2014

(87) PCT Pub. No.: WO2013/011904
PCT Pub. Date: Jan. 24, 2013

(65) Prior Publication Data
US 2014/0144169 A1    May 29, 2014

(30) Foreign Application Priority Data
Jul. 15, 2011    (JP) .................................. 2011-156852

(51) Int. Cl.
*F25D 23/12*    (2006.01)
*H05K 7/20*    (2006.01)
(Continued)

(52) U.S. Cl.
CPC ........ *H05K 7/20309* (2013.01); *F28D 15/0266* (2013.01); *G06F 1/20* (2013.01); *H05K 7/20318* (2013.01); *H05K 7/20727* (2013.01); *H05K 7/20818* (2013.01); *G06F 2200/201* (2013.01)

(58) Field of Classification Search
CPC ...... H01L 23/427; F25B 38/02; F25B 39/028
USPC ............. 62/259.2, 515, 519, 525; 165/104.21
See application file for complete search history.

(56) References Cited

U.S. PATENT DOCUMENTS 3,878,054 A * 4/1975 Rodgers .................... B01D 1/10
159/DIG. 27
(Continued)

FOREIGN PATENT DOCUMENTS
CN    101069057 A    11/2007
CN    101356414 A    1/2009
(Continued)

OTHER PUBLICATIONS
International Search Report corresponding to PCT/JP2012/067762, mailed Aug. 14, 2012 (6 pages).
(Continued)

*Primary Examiner* — Melvin Jones
(74) *Attorney, Agent, or Firm* — Wilmer Cutler Pickering Hale and Dorr LLP

(57) ABSTRACT

A cooling system comprising: an evaporator for evaporating a refrigerant by performing heat exchange with outside air; a condenser for condensing a gas refrigerant into a liquid refrigerant by making a refrigerant and a cooling medium perform heat exchange with each other; a gas refrigerant pipe and a liquid refrigerant pipe connecting the evaporator and the condenser; and the evaporator including: an upper part header provided in a highest position of the evaporator, and connected with the condenser by the gas refrigerant pipe, through the gas refrigerant pipe a gas refrigerant flowing; a lower part header provided in a lowest position of the evaporator, and connected with the condenser by the liquid refrigerant pipe, through the liquid refrigerant pipe a liquid refrigerant flowing; a middle header provided in an intermediate position between the upper part header and the lower part header, and connected with the condenser by the liquid refrigerant pipe, through the liquid refrigerant pipe the liquid refrigerant flowing; an upper part evaporator, arranged between the upper part header and the middle header, including an upper part steam generating tube having a first flow path for leading a refrigerant of the middle header to the upper part header while making the refrigerant of the middle header perform heat exchange with outside air and having a second flow path for leading a refrigerant of the lower part header to the upper part header while making the refrigerant of the lower part header perform heat exchange with outside air; and a lower part evaporator, arranged between the lower part header and the middle header, including a lower part steam generating tube having a third flow path inserted into the middle header while making a refrigerant of the lower part header perform heat exchange with outside air, the lower part steam generating tube communicated with the second flow path of the upper part steam generating tube.

13 Claims, 8 Drawing Sheets

(51) Int. Cl.
*G06F 1/20* (2006.01)
*F28D 15/02* (2006.01)

(56) References Cited

U.S. PATENT DOCUMENTS

| | | | |
|---|---|---|---|
| 6,019,070 A * | 2/2000 | Duffy | F22B 1/1815 122/209.1 |
| 2008/0121387 A1 | 5/2008 | Taniguchi et al. | |
| 2008/0190382 A1 * | 8/2008 | Bruckner | F22B 37/26 122/7 R |
| 2009/0100848 A1 | 4/2009 | Kuriyama et al. | |

FOREIGN PATENT DOCUMENTS

| | | |
|---|---|---|
| CN | 101420839 A | 4/2009 |
| EP | 2053911 A2 | 4/2009 |
| JP | 2006-153360 A | 6/2006 |
| JP | 2008-249252 A | 10/2008 |
| JP | 2009-105143 A | 5/2009 |
| JP | 2009-193137 A | 8/2009 |
| JP | 2009-193244 A | 8/2009 |
| KR | 10-2007-88654 A | 8/2007 |
| WO | WO-2006-059498 A1 | 6/2006 |
| WO | WO-2008-123603 A1 | 10/2008 |

OTHER PUBLICATIONS

Written Opinion (Form PCT/ISA/237—English version), Abstract of Citation (1 page).
Microfilm of the specification and drawings annexed to the request of Japanese Utility Model Application No. 40791/1973 (Laid-open No. 142859/1974), Mitsui Engineering & Shipbuilding Co., Ltd., Dec. 10, 1974, entire text; fig. 1, 2.
Microfilm of the specification and drawings annexed to the request of Japanese Utility Model Application No. 77465/1985 (Laid-open No. 192171/1986), Toyo Radiator Co., Ltd, Nov. 29, 1986, entire text; fig. 1, 2.
Chinese First Notification of First Office Action corresponding to Chinese Application No. 201280035222.6, dated Jun. 3, 2015, 10 pages.

* cited by examiner

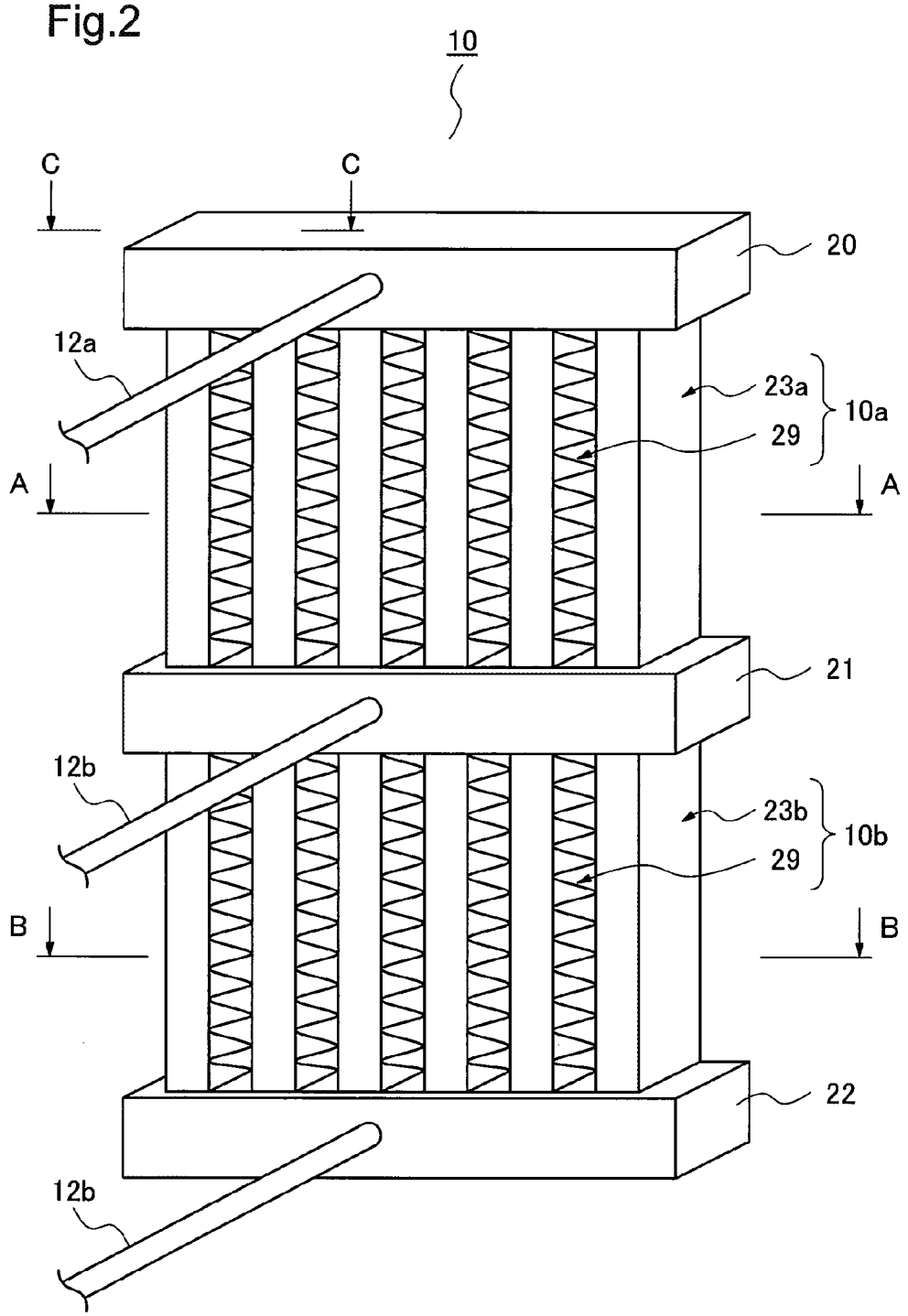

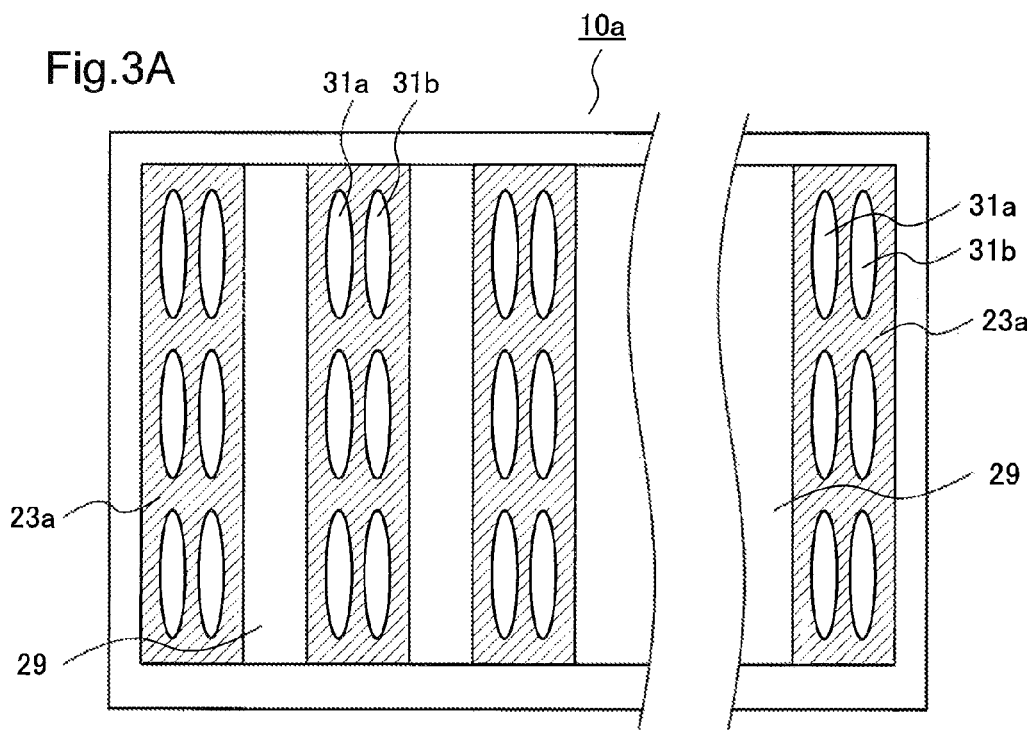
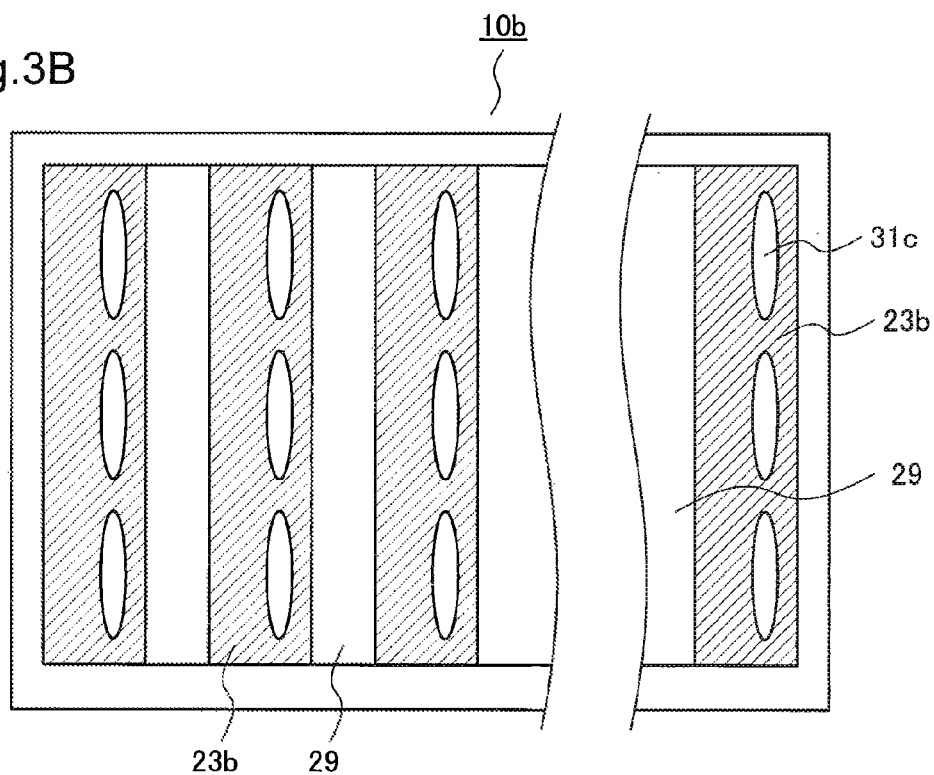

COOLING SYSTEM AND DEVICE HOUSING APPARATUS USING THE SAME

CROSS-REFERENCE TO RELATED APPLICATIONS

This application is a national stage application of International Application No. PCT/JP2012/067762 entitled "Cooling System and Device Housing Apparatus Using the Same," filed on Jul. 5, 2012, which claims the benefit of the priority of Japanese patent application No. 2011-156852, filed on Jul. 15, 2011, the disclosures of each of which are hereby incorporated by reference in their entirety.

TECHNICAL FIELD

The present invention relates to a cooling system for cooling electronic devices, and a device housing apparatus which is equipped with this cooling system and stores a plurality of electronic devices.

BACKGROUND ART

In recent years, the amount of information processing that is needed is increasing along with improvement of the information processing technology, development of the internet environment and the like. In such situation, data center business to install and operate electronic devices of such as a server for internet, data communication equipment, a fixed-line phone, a cellular phone and an IP telephone in a concentrated manner is being paid attention. Generally, a plurality of such electronic devices are housed in a rack or the like. Then, a plurality of such racks are installed in a server room.

Meanwhile, by heat from electronic devices, a room temperature in a server room rises. Accordingly, air-conditioning equipment is installed usually in a server room, and control of temperature is performed.

However, by progress of consolidation of electronic devices along with increase of the information processing amount and increase of heat released from each electronic device, a load of air-conditioning equipment which controls the temperature of a server room is becoming large. Accordingly, technologies aimed at a load reduction of air-conditioning equipment have been proposed.

For example, in Japanese Patent Application Laid-Open No. 2009-193244, there is proposed a cooling system that has a server rack into which a plurality of electronic devices are mounted, an evaporator which makes a refrigerant be vaporized by exhaust heat of the electronic devices, and a condensing unit installed in a place higher than the evaporator, and makes the refrigerant perform natural circulation using a difference in densities of the refrigerant in the vapor and liquid states.

In Japanese Patent Application Laid-Open No. 2009-193137, there is proposed a cooling system that houses a plurality of electronic devices with a fan, and includes: a cabinet having a front face and a back face that are open; and a rear door that is provided in the opening of the back face side of the cabinet, and capable of ventilation. Between the rear door and the electronic devices, there are arranged a plurality of fin-and-tube type evaporators that form a refrigerating cycle, and refrigerant pipes of a plurality of evaporators are provided corresponding to a plurality of electronic devices.

DISCLOSURE OF THE INVENTION

Problems to be Solved by the Invention

However, in the technology according to Japanese Patent Application Laid-Open No. 2009-193244 mentioned above, there is a problem that, because one large evaporator of a fin-and-tube type is used for a plurality of servers, the upper part of a tube in an evaporator is occupied by a vaporized refrigerant, and, as a result, heat exchange cannot be performed efficiently.

In technology according to Japanese Patent Application Laid-Open No. 2009-193137, although a plurality of fin-and-tube type evaporators which form a freezing cycle are arranged between the rear door of a server rack and electronic devices, and refrigerant pipes of a plurality of evaporators are provided corresponding to a plurality of electronic devices, there is a problem that an external power such as a compressor is needed because a freezing cycle is being used, resulting in increase of electric power required for air conditioning of a data center.

Accordingly, a main object of the present invention is to provide a cooling system that does not need an element such as a compressor and is capable of exchanging heat with a cooling object efficiently, and a device housing apparatus using that.

Means for Solving the Problems

In order to settle the above-mentioned problem, the invention for a cooling system configures an evaporator by: an upper part header provided in a highest position of the evaporator, and connected with the condenser by the gas refrigerant pipe, through the gas refrigerant pipe a gas refrigerant flowing; a lower part header provided in a lowest position of the evaporator, and connected with the condenser by the liquid refrigerant pipe, through the liquid refrigerant pipe a liquid refrigerant flowing; a middle header provided in an intermediate position between the upper part header and the lower part header, and connected with the condenser by the liquid refrigerant pipe, through the liquid refrigerant pipe the liquid refrigerant flowing; an upper part evaporator, arranged between the upper part header and the middle header, including an upper part steam generating tube having a first flow path for leading a refrigerant of the middle header to the upper part header while making the refrigerant of the middle header perform heat exchange with outside air and having a second flow path for leading a refrigerant of the lower part header to the upper part header while making the refrigerant of the lower part header perform heat exchange with outside air; and a lower part evaporator, arranged between the lower part header and the middle header, including a lower part steam generating tube having a third flow path inserted into the middle header while making a refrigerant of the lower part header perform heat exchange with outside air, the lower part steam generating tube communicated with the second flow path of the upper part steam generating tube.

The invention for a device housing apparatus includes: a rack for mounting a plurality of electronic devices; a cooling system according to any one of claims 1 to 8 provided corresponding to the rack; and an air blower for taking in outside air and blowing the taken air at the electronic device to cool the electronic device and blowing out the outside air having a temperature risen by the electronic device via the cooling system.

Advantage of the Invention

According to the present invention, an element such as a compressor is not needed and heat exchange with a cooling object can be performed efficiently.

BRIEF DESCRIPTION OF THE DRAWINGS

FIG. 2 is a perspective view of an evaporator according to the first exemplary embodiment;

FIG. 3A is a horizontal sectional view of an upper part evaporator of an evaporator according to the first exemplary embodiment taken along line A-A of FIG. 2;

FIG. 3B is a horizontal sectional view of the lower part evaporator of an evaporator according to the first exemplary embodiment taken along line B-B of FIG. 2;

BEST MODE FOR CARRYING OUT THE INVENTION

The First Exemplary Embodiment

Figure 1:
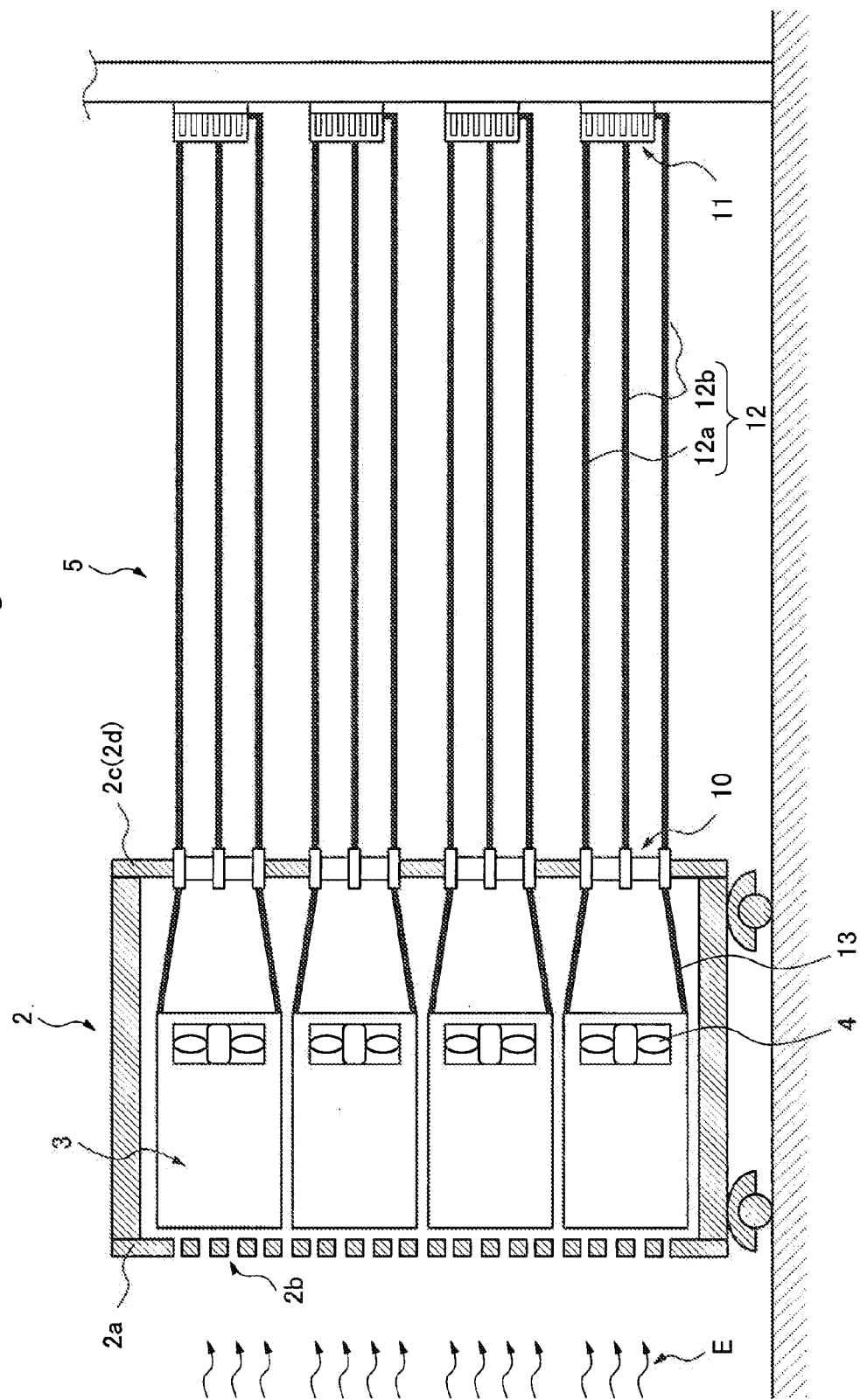
FIG. 1 is a sectional side view of a device housing apparatus having a cooling system according to a first exemplary embodiment of the present invention.

The first exemplary embodiment of the present invention will be described. FIG. 1 is a sectional side view of a device housing apparatus 2 having a cooling system 5 according to the first exemplary embodiment of the present invention. Meanwhile, because it is often the case that a plurality of pieces such device housing apparatus 2 are installed inside a building such as a machine room and a data center, description will be made assuming that the installation site of the device housing apparatus 2 is a machine room in the following description.

The device housing apparatus 2 is almost a box-like object having a rack structure or the like that stores a plurality of pieces of electronic device 3. There are provided a plurality of pieces of inlet 2b in a front plate 2a (the side plate in the left side in FIG. 1) of the device housing apparatus 2, and a rear door 2d is provided in a back plate 2c (the side plate in the right side in FIG. 1). FIG. 1 indicates a case where the back plate 2c serves also as the rear door 2d.

A plurality of pieces of inlet 2b are arranged in a zigzag manner or the like. That is, when outside air E is drawn in from the inlet 2b, a turbulent flow may occur, and a volume of drawn-in air may have a distribution relative to the plate face of the front plate 2a. Such turbulent flow and a distribution of an air volume will be a factor to cause a noise and unevenness of cooling. Accordingly, in this exemplary embodiment, suppression of a turbulent flow of air drawn in from each inlet 2b and equalization of air volumes are realized by providing a plurality of pieces of inlet 2b and arranging those in a specified shape. From this meaning, an arrangement shape of the inlet 2b is not limited to a zigzag shape. Meanwhile, the rear door 2d is a door opened and shut when the electronic device 3 is housed in the device housing apparatus 2, and an evaporator 10 in the cooling system 5 mentioned later is fixed to it.

The electronic device 3 has: a heat generating component (not shown) such as a CPU, a hard disk and a memory; and an air blower 4 which blows air for cooling at this heat generating component. Meanwhile, the air blower 4 can be included in the cooling system 5. As such electronic device 3, there can be illustrated a rack-mount type server such as a server rack of the 1U type and a server rack of the 4U type, and a blade server and the like. However, this exemplary embodiment is not limited to these as the electronic device 3, and it should only be an electronic device having a heat generating component.

The cooling system 5 includes the evaporator 10, a condenser 11, a refrigerant pipe 12 connecting the evaporator 10 and the condenser 11, and a duct 13 which connects the electronic device 3 and the condenser 11 in a manner enclosing them.

The size of the evaporator 10 is set to a smaller size than the size of the electronic device 3 to be stored in the device housing apparatus 2 appropriately. Here, a size means height and width sizes when the electronic device 3 is seen from the rear door 2d. By being set to such size, it becomes possible to install the evaporator 10 for each electronic device 3 housed in the device housing apparatus 2. That is, it becomes possible to provide one evaporator 10 to one electronic device 3. Air which is blown at the electronic device 3 by the air blower 4 passes the evaporator 10 guided by the duct 13. At that time, because the size of the evaporator 10 is smaller than the size of the electronic device 3, air which has passed the electronic device 3 will pass the evaporator 10 in a manner being squeezed. By squeezing the air, the density becomes large. When the density of air becomes large, the thermal conductivity of the air becomes large, and the heat exchanging efficiency improves.

However, when the size of the evaporator 10 is too smaller than the size of the electronic device 3, a flow resistance of air when flowing into the evaporator 10 becomes large because a squeezed amount of the air by the duct 13 also becomes large. Accordingly, the size of the evaporator 10 is determined in view of a balance between: a size of the electronic device 3, a blowing amount, surface roughness or the like of the duct 13; and a flow resistance.

The refrigerant pipe 12 is a flexible pipe having elasticity and plasticity, and includes two kinds of pipes of: a gas refrigerant pipe 12a through which a refrigerant of gas (gas refrigerant) flows; and a liquid refrigerant pipe 12b through which a refrigerant of liquid (liquid refrigerant) flows. Meanwhile, as mentioned later, although two pieces of liquid refrigerant pipe 12b are provided, this exemplary embodiment does not limit the number of pieces of gas refrigerant pipe 12a and liquid refrigerant pipe 12b.

As a material of the refrigerant pipe 12, when a refrigerant is hydrofluoroether, butyl rubber and silicone rubber and the like are preferred. Of course, this exemplary embodiment is not limited to butyl rubber, silicone rubber and the like as a material of the refrigerant pipe 12, and it is decided from a view point of such as a chemical stability to a refrigerant and easiness and the like of production and piping work of the refrigerant pipe 12. Therefore, it is possible to use a metal material such as aluminum and copper.

As shown in FIG. 2, the evaporator 10 includes the upper part header 20, middle header 21, the lower part header 22, an upper part evaporator 10a sandwiched by the upper part header 20 and the middle header 21, and a lower part evaporator 10b sandwiched by the middle header 21 and the lower part header 22. The evaporator 10 is fixed to an opening formed by opening a part of the rear door 2d. Meanwhile, FIG. 2 is a perspective view of the evaporator 10.

Inside the evaporator 10, there is enclosed an organic refrigerant (hereinafter, it is simply described as a refrigerant)

such as hydrofluoroether. Hydrofluoroether is a refrigerant which experiences a boiling phenomenon at a room temperature (about 25° C.) or more.

Figure 4:
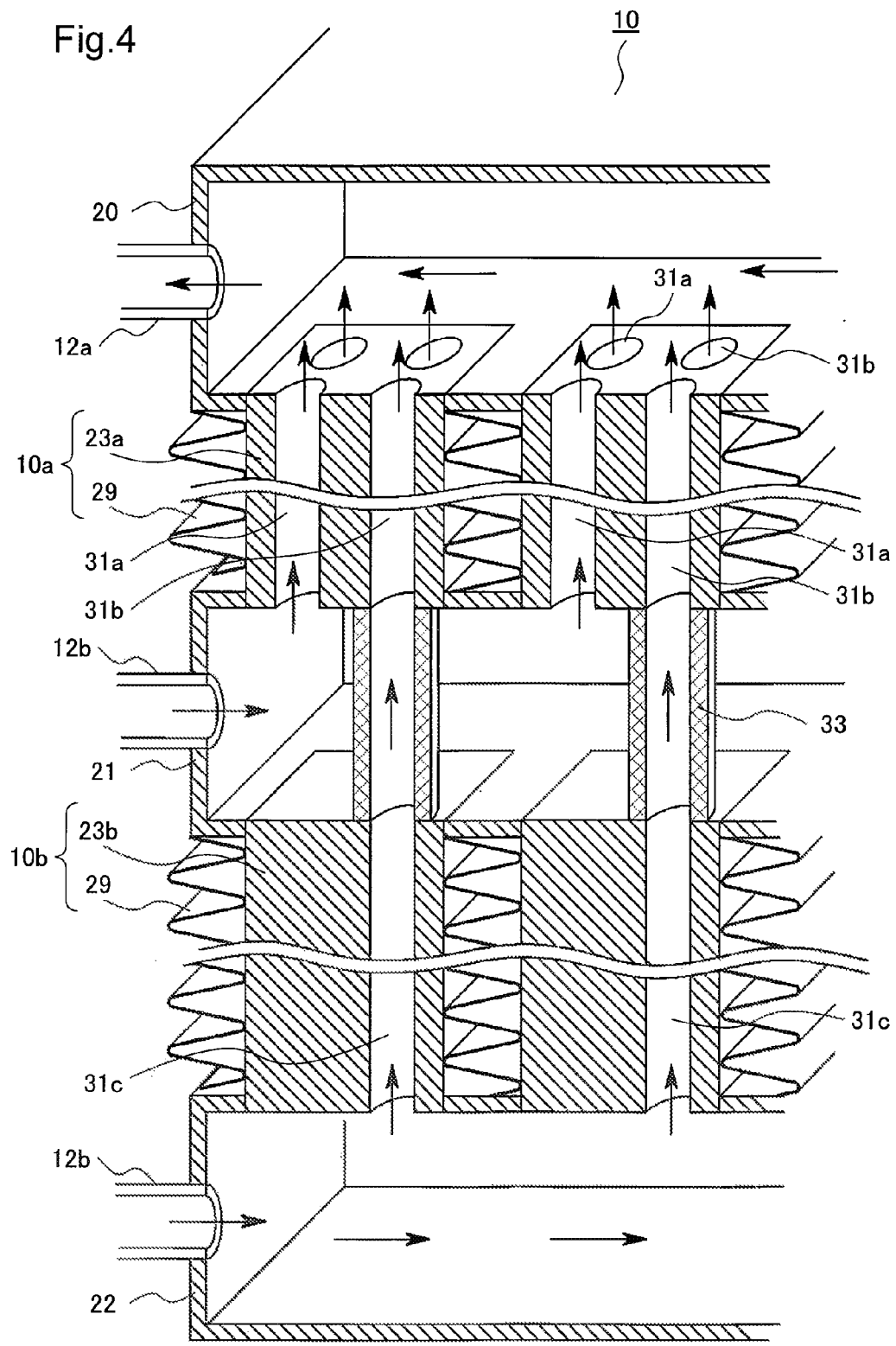
FIG. 4 is a vertical sectional view of an evaporator according to the first exemplary embodiment taken along line C-C of FIG. 2.

FIG. 3 indicates horizontal sectional views of the evaporator 10, and FIG. 3A is a horizontal sectional view of the upper part evaporator 10a taken along line A-A in FIG. 2 and FIG. 3B is a horizontal sectional view of the lower part evaporator 10b taken along line B-B. Further, FIG. 4 is a vertical sectional view of the evaporator 10 taken along line C-C in FIG. 2. In this regard, however, in FIG. 4, indication is being made in a manner including the refrigerant pipe 12.

The upper part evaporator 10a is formed by a plurality of pieces of upper part steam generating tube 23a and a fin 29 fixed to this upper part steam generating tube 23a. Similarly, the lower part evaporator 10b is formed by a plurality of pieces of lower part steam generating tube 23b and the fin 29 fixed to this lower part steam generating tube 23b. The upper part steam generating tube 23a is a multi-hole pipe in which a first flow path 31a and a second flow path 31b are formed plurally, and the lower part steam generating tube 23b is a multi-hole pipe in which a third flow path 31c is formed plurally.

The fin 29 is formed by a sheeted member of a superior thermal conductivity such as aluminum and copper, and is fixed to the upper part steam generating tube 23a and the lower part steam generating tube 23b by a brazing filler material or the like in a manner thermally contacting with them. This fin 29 is provided in order to increase a heat exchange area by making an area to which outside air touches large.

As shown in FIG. 4, the first flow path 31a and the second flow path 31b make the middle header 21 and the upper part header 20 communicate with each other, and the third flow path 31c makes the middle header 21 and the lower part header 22 communicate with each other.

At that time, because the upper part steam generating tube 23a and the lower part steam generating tube 23b are not provided in a way that they reach inside the middle header 21, the second flow path 31b of the upper part steam generating tube 23a and the third flow path 31c of the lower part steam generating tube 23b are in the state that they are not connected with each other in the middle header 21. Accordingly, it is arranged so that, by providing a bypass pipe 33 in this middle header 21, the second flow path 31b of the upper part steam generating tube 23a and the third flow path 31c of the lower part steam generating tube 23b may communicate with each other without communicating with a space in the middle header 21.

Meanwhile, in FIG. 3, 4 and the like, although a case where the horizontal cross-sectional shapes of the upper part steam generating tube 23a and the lower part steam generating tube 23b are a rectangle, and the horizontal cross-sectional shapes of the first flow path 31a, the second flow path 31b and the third flow path 31c is an ellipsoid is indicated, this exemplary embodiment is not limited to these shapes. In addition, although a case where the number of pieces of first flow path 31a, second flow path 31b and third flow path 31c is three, respectively, is illustrated, this exemplary embodiment does not limit such number.

By such structure, a refrigerant of the middle header 21 flows into the upper part header 20 via the first flow path 31a of the upper part steam generating tube 23a. On the other hand, a refrigerant of the lower part header 22 flows into the upper part header 20 via the third flow path 31c of the lower part evaporator 10b, the bypass pipe 33 and the second flow path 31b of the upper part steam generating tube 23a.

The reason that the second flow path 31b and the third flow path 31c are connected thus by the bypass pipe 33 is as follows. That is, in the evaporator 10, a refrigerant performs heat exchange with outside air. At that time, in the case of hydrofluoroether where a refrigerant boils at the neighborhood of the room temperature mentioned above, it boils and evaporates by heat exchange with outside air.

This heat exchange is performed mainly in the upper part evaporator 10a and the lower part evaporator 10b that have a large thermal contact area with the outside air. Accordingly, a refrigerant in the first flow path 31a, the second flow path 31b and the third flow path 31c will be in a vapor-liquid mixed state in which a gas refrigerant exists in a bubble shape in a liquid refrigerant. When a refrigerant is in the vapor-liquid mixed state, a flow path resistance is larger than a case of liquid. That is, an amount of a refrigerant that performs heat exchange will be small.

In addition, because a density of a gas refrigerant is smaller than that of a liquid refrigerant generally, a heat exchanging efficiency of a gas refrigerant is less than that of a liquid refrigerant. Accordingly, because, in a vapor-liquid mixed state, heat exchange between a liquid refrigerant and outside air is disturbed by a gas refrigerant existing between them, a heat exchanging efficiency will be smaller than the case when performing heat exchange with a liquid refrigerant, although it is larger than a heat exchanging efficiency when performing heat exchange with a gas refrigerant.

When this is referred to from a view point of a flow path length, it can be said that the longer a flow path length is, the larger a ratio of a gas refrigerant amount to a liquid refrigerant amount (gas refrigerant amount/liquid refrigerant amount) in the neighborhood of the exit of a flow path is, and, conversely, the shorter a flow path length is, the smaller the ratio is.

The most suitable flow path length can be defined from such view point. However, because the most suitable flow path length is decided irrespective of the size of the electronic device 3, a case in which the most suitable flow path length is very smaller than the size of this electronic device 3 (in particular, the size in the vertical direction) occurs. In this case, decrease of the heat exchanging efficiency may occur because a degree that an air flowing into the evaporator 10 is squeezed by the duct 13 becomes large.

When an evaporator is composed only by a steam generating tube with the most suitable flow path length (an evaporator which includes the upper part header 20 and the lower part header 22, and does not have the middle header 21), necessity to line up steam generating tubes in the flowing direction of the air presents itself in order to secure a predetermined heat exchange amount. That is, an evaporator comes to have a longer size in the flowing direction of air. In such evaporator, there is inconvenience that a flow resistance of an air is large. Further, because temperature of air which passes an evaporator is higher at the air flowing-in part of the evaporator and lower at the air flowing-out part of the evaporator, a temperature difference between the air flowing-in part and the air flowing-out part is large in an evaporator with a long size in the flowing direction of the air. Because a thermal conductivity is proportional to a temperature difference as the first-order approximation, air in the neighborhood of the air flowing-out part where a temperature difference is small (that is, a temperature difference with a refrigerant is small) cannot perform a heat exchange efficiently.

From such view point, the evaporator 10 is made be of a multiple-stage form of two-stages: the upper part evaporator 10a; and the lower part evaporator 10b, in this exemplary embodiment as mentioned above. Meanwhile, this exemplary embodiment does not limit an exchanger to a two-stage structure. By making the evaporator 10 be of multiple stages, even when the most suitable flow path length is shorter than the size of an electronic device, the evaporator 10 with the size corresponding to the size of the electronic device 3 can be produced easily and the evaporator 10 that is not long in the flowing direction of air can be produced easily. Accordingly, it becomes possible to produce the evaporator 10 having a high heat exchanging efficiency inexpensively.

A bypass pipe 33 shown in FIG. 4 etc. has had an oval cross-sectional shape. Also, a structure in which the upper part steam generating tube 23a and the lower part steam generating tube 23b are fixed to the chassis of the middle header 2 and do not extend in the middle header 211 has been indicated. However, this exemplary embodiment is not limited to such shape.

Figure 5:
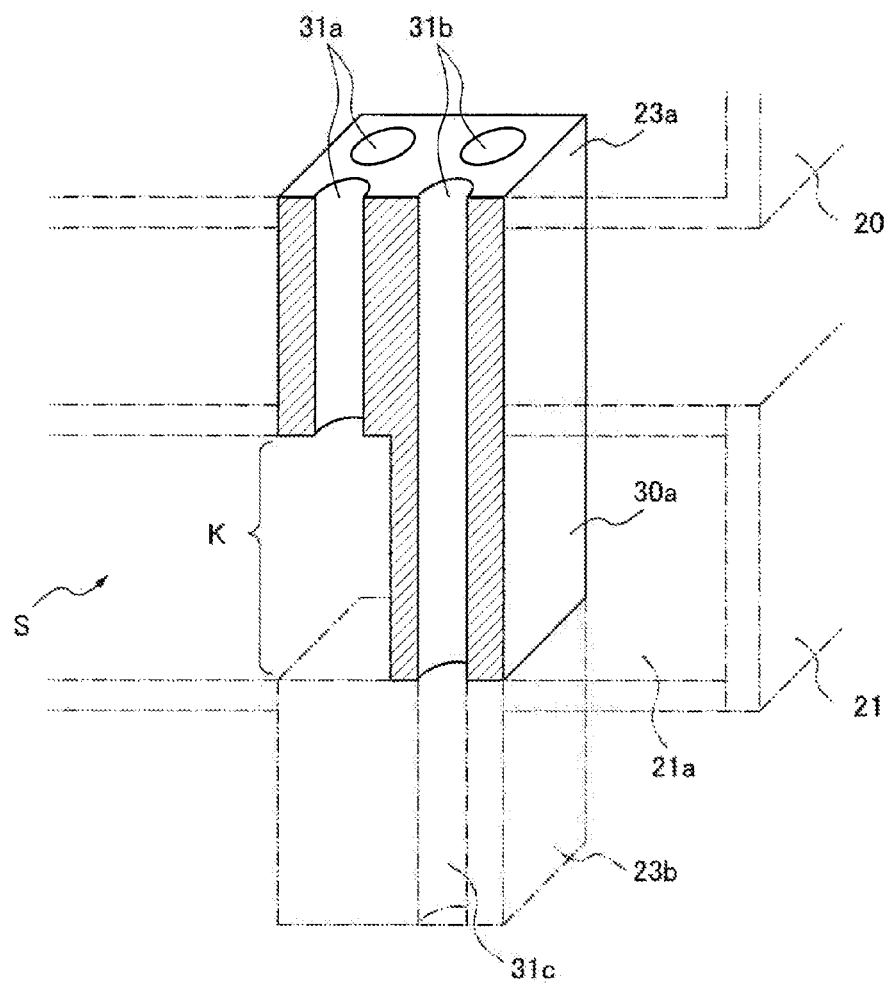
FIG. 5 is a vertical sectional view of an upper part steam generating tube of another structure according to the first exemplary embodiment.

For example, it may be of a structure in which the upper part steam generating tube 23a extends to a bottom face 21a of the middle header 21 as shown in FIG. 5. Such structure can be produced easily by, about the upper part steam generating tube 23a mentioned above, cutting out a part (the area K in FIG. 5) of this upper part steam generating tube 23a so that an internal space S of the middle header 21 and the first flow path 31a may be communicated with each other. Further, there is an advantage that adjustment work of the second flow path 31b of the upper part steam generating tube 23a and the bypass pipe 30 which is needed when the bypass pipe 33 is used becomes unnecessary. Meanwhile, it is also possible to form a bypass pipe in a manner being united with the lower part steam generating tube 23b.

Figure 6:
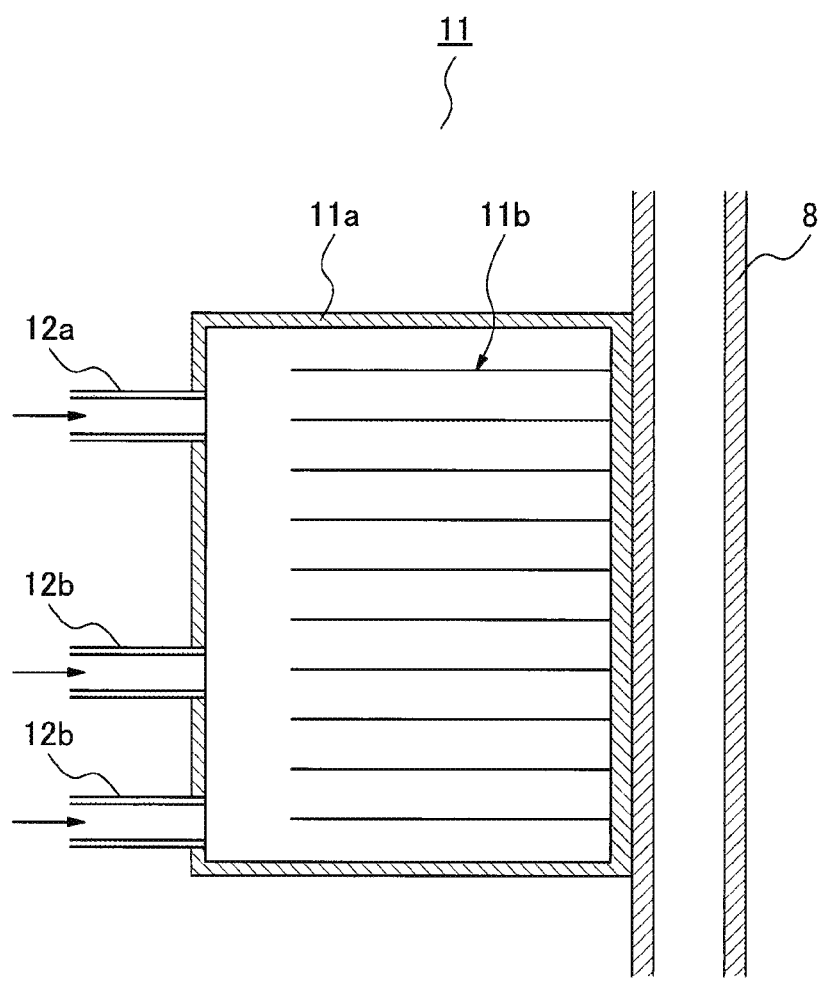
FIG. 6 is a sectional view of a condenser according to the first exemplary embodiment.

As shown in FIG. 6, the condenser 11 is a metal box in which a fin 11b is fixed to an inner wall of a chassis 11a, and the chassis 11a is fixed to a cooling pipe 8 through which a cooling medium such as water flows. Meanwhile, it is preferred that a side of the chassis 11a to which the fin 11b is fixed is a side of the chassis fixed with the cooling pipe 8 (it corresponds to the side plate of the right side in FIG. 6). The reason of this is to make the heat exchanging efficiency good by making the temperature gradient large by making the heat conduction path between a refrigerant and a cooling medium short. FIG. 6 indicates a sectional view of the condenser 11.

A refrigerant from the evaporator 10 flows into the chassis 11b via the gas refrigerant pipe 12a, and performs heat exchange via the fin 11b and the like with a cooling medium in the cooling pipe 8 to which this chassis 11b is fixed. A temperature of the cooling medium is set to a temperature lower than a temperature of a gas refrigerant which flows into the chassis 11a. Accordingly, the refrigerant will radiate heat to the cooling medium via the fin 11b. By this heat radiation, the refrigerant makes a phase change (is condensed) to liquid from gas, and returns to the evaporator 10 via the liquid refrigerant pipe 12b.

Figure 7:
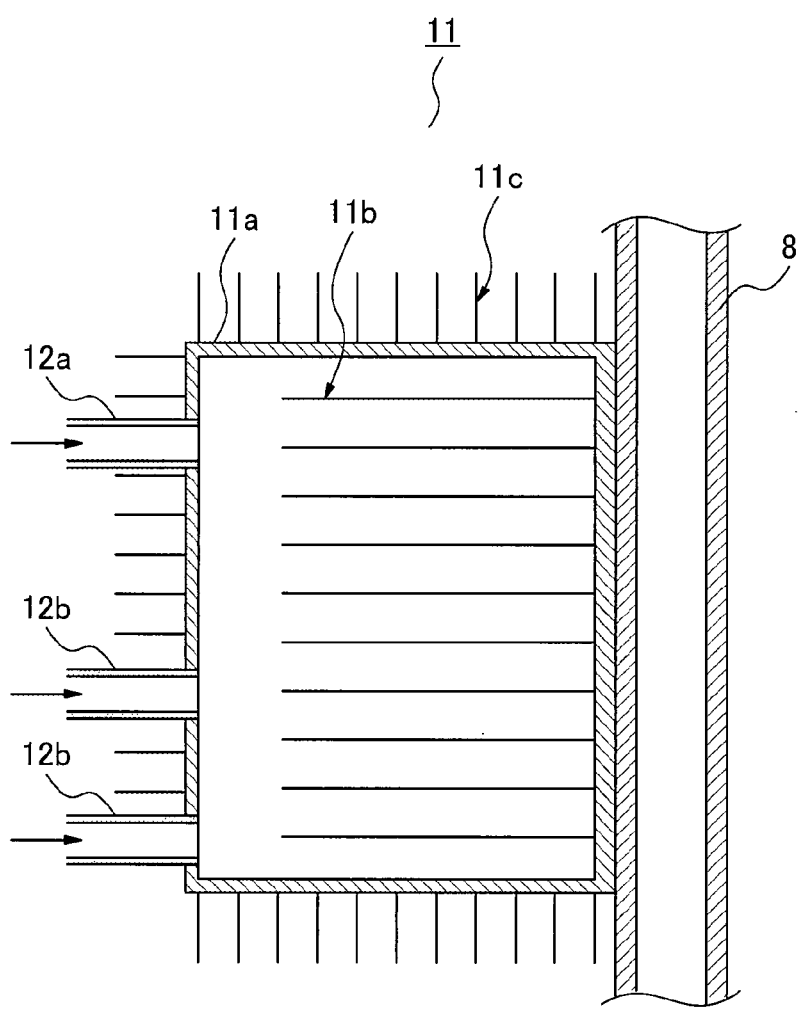
FIG. 7 is a sectional view of a condenser of another structure according to the first exemplary embodiment.

Meanwhile, in a case where the condenser 11 performs heat exchange with an outside air, it is preferred to provide a fin 11c on an outer surface of the condenser 11 as shown in FIG. 7. FIG. 7 is a sectional view of the condenser 11 having the fin 11c on an outer surface of the chassis 11a. As a result, the condenser 11 can exchange heat also with an outside air. When the condenser 11 is installed outside the machine room, it is preferred to provide the fin 11c on an outer surface of the chassis 11a. In this regard, however, it is premised that the temperature of outside air which the chassis 11a touches is lower than that of a gas refrigerant.

Next, operations of the cooling system 5 of the aforementioned constitution will be described. The electronic device 3 and the air blower 4 operate. As a result, outside air is taken into the device housing apparatus 2 from the inlet 2b by the air blower 4. an intake air blows and hits the electronic device 3, and cools heat generating components of the electronic device 3. Accordingly, the temperature of the air rises.

After that, the air whose temperature has been risen is made to blow and hit against the evaporator 10 via the duct 13. In the evaporator 10, there is stored a liquid refrigerant in the room temperature that is in the state of immediately below boiling point. The evaporator 10 includes the middle header 21 and the lower part header 22 which store a liquid refrigerant, the lower part header 22 is communicated with the upper part header 20 via the third flow path 31c and the second flow path 31b, and the middle header 21 is communicated with the upper part header 20 via the first flow path 31a. Accordingly, air performs heat exchange with a liquid refrigerant in the first flow path 31a, the second flow path 31b and the third flow path 31c via the fin 29 of the lower part steam generating tube 23b and the upper part steam generating tube 23a.

By this heat exchange, a liquid refrigerant in the first flow path 31a, the second flow path 31b and the third flow path 31c come to boil and be in a vapor-liquid mixed state. That is, the air whose temperature has been risen as a result of cooling the electronic device 3 radiates heat to a refrigerant by performing heat exchange with this refrigerant. A refrigerant which has been vaporized by performing heat exchange exists in the state of a bubble in a liquid refrigerant, and grows gradually and flows toward the side of the upper part header 20.

At that time, in the case of the evaporator 10 in which the middle header 21 does not exist, for example, a state that only a gas refrigerant exists in the first flow path 31a in the near field region of the upper part header 20 may occur because there is only the first flow path 31a. In this case, a refrigerant cannot be evaporated efficiently (the heat of air whose temperature has been risen cannot be radiated to the refrigerant efficiently).

In contrast, by making it be a multiple-stage evaporator like this exemplary embodiment, it is possible to compose an evaporator in which the first flow path 31a, the second flow path 31b and the third flow path 31c are always filled with a refrigerant of a vapor-liquid mixed state. Accordingly, decrease of the heat exchanging efficiency can be suppressed.

Meanwhile, in a vapor-liquid mixed state, a gas refrigerant rises toward the upper part header 20 by buoyancy due to a difference in specific gravity with a liquid refrigerant. Accordingly, a pressure of the upper part header 20 rises, and, by this pressure, a gas refrigerant flows toward the condenser 11 side via the gas refrigerant pipe 12a.

A gas refrigerant flowing into the condenser 11 performs heat exchange with a cooling medium which flows through the cooling pipe 8 via the fin 11b in the condenser 11. Because the temperature of this cooling medium is set to a temperature lower than the temperature of the gas refrigerant, the gas refrigerant radiates heat to the cooling medium and liquefies. A refrigerant which has liquefied is stored in the condenser 11, and flows into the evaporator 10 via the liquid refrigerant pipe 12b by a pressure difference with the evaporator 10.

By repeating such closed cycle, heat released by a heat generating component of the electronic device 3 is radiated to a cooling medium. Accordingly, a temperature rise of a machine room can be suppressed.

Meanwhile, FIG. 6 indicates a case where two pieces of liquid refrigerant pipe 12b are provided up and down. In this case, the height position of the inlet of the liquid refrigerant pipe 12b in the upper side or the refrigerant amount is set so that, in the regular cycle, the inlet of the liquid refrigerant pipe 12b of the upper side may be lower than the water level of a liquid refrigerant stored in the condenser 11. Accordingly, inconvenience that a gas refrigerant that has flowed into the condenser 11 via the gas refrigerant pipe 12a flows into the evaporator 10 via the liquid refrigerant pipe 12b in the state of a gas refrigerant just as it is prevented. Also, it is preferred that a heat insulation measure is applied to the liquid refrigerant pipe 12b in order to prevent evaporation by heat exchange with outside air when flowing into the evaporator 10 from the condenser 11.

Second Exemplary Embodiment

Next, the second exemplary embodiment of the present invention will be described. Meanwhile, about the same structures as the first exemplary embodiment, the description will be omitted appropriately using identical codes.

In the first exemplary embodiment, the inner walls of the first flow path, the second flow path and the third flow path are of a simple circularity or an ellipsoid. On the other hand, in this exemplary embodiment, there is provided a convex portion in an inner wall of the first flow path, the second flow path and the third flow path along the lengthwise direction.

Figure 8:
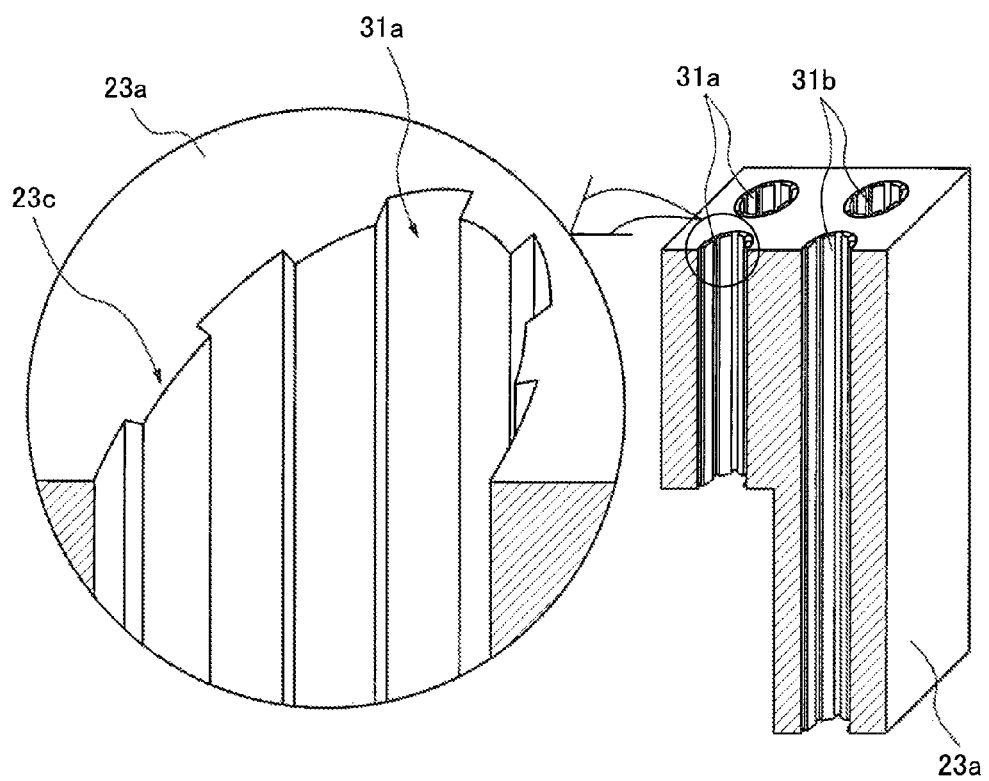
FIG. 8 is a fragmentary perspective view of an upper part steam generating tube having a convex portion according to the second exemplary embodiment of the present invention.

FIG. 8 is a fragmentary perspective view of the upper part steam generating tube 23a having a convex portion 23c. As shown in this figure, the convex portion 23c is formed onto the inner walls of the first flow path 31a, the second flow path 31b and the third flow path 31c along a flow path. By this convex portion 23c, the heat exchanging efficiency between outside air and a refrigerant can be improved because the area of a flow path is increased. Accordingly, the heat exchanging efficiency of the evaporator 10 improves.

The features of the present invention that have been described above are summarized as supplementary notes below.

(Supplementary note 1) A cooling system for cooling an electronic device, comprising: an evaporator for evaporating a refrigerant by performing heat exchange with outside air; a condenser for condensing a gas refrigerant into a liquid refrigerant by making a refrigerant and a cooling medium perform heat exchange with each other; a gas refrigerant pipe and a liquid refrigerant pipe connecting the evaporator and the condenser; and the evaporator including:

an upper part header provided in a highest position of the evaporator, and connected with the condenser by the gas refrigerant pipe, through the gas refrigerant pipe a gas refrigerant flowing;

a lower part header provided in a lowest position of the evaporator, and connected with the condenser by the liquid refrigerant pipe, through the liquid refrigerant pipe a liquid refrigerant flowing;

a middle header provided in an intermediate position between the upper part header and the lower part header, and connected with the condenser by the liquid refrigerant pipe, through the liquid refrigerant pipe the liquid refrigerant flowing;

an upper part evaporator, arranged between the upper part header and the middle header, including an upper part steam generating tube having a first flow path for leading a refrigerant of the middle header to the upper part header while making the refrigerant of the middle header perform heat exchange with outside air and having a second flow path for leading a refrigerant of the lower part header to the upper part header while making the refrigerant of the lower part header perform heat exchange with outside air; and a lower part evaporator, arranged between the lower part header and the middle header, including a lower part steam generating tube having a third flow path inserted into the middle header while making a refrigerant of the lower part header perform heat exchange with outside air, the lower part steam generating tube being communicated with the second flow path of the upper part steam generating tube.

(Supplementary note 2) The cooling system according to supplementary note 1, wherein
a convex portion extending along a flow path direction of a refrigerant is formed in a flow path inner wall of at least one of the first flow path, the second flow path and the third flow path.

(Supplementary note 3) The cooling system according to supplementary note 1 or 2, wherein
a fin is fixed to an outer wall of the upper part steam generating tube and the lower part steam generating tube in a thermally contacting manner.

(Supplementary note 4) The cooling system according to any one of supplementary notes 1 to 3, wherein
the middle header includes a bypass pipe for making the second flow path of the upper part evaporator and the third flow path of the lower part evaporator communicate with each other.

(Supplementary note 5) The cooling system according to any one of supplementary notes 1 to 3, wherein
the bypass pipe is formed in a manner being integrated with the upper part steam generating tube or the lower part steam generating tube.

(Supplementary note 6) The cooling system according to any one of supplementary notes 1 to 5, wherein
the condenser includes a fin fixed to an inner wall of the condenser in a thermally contacting manner.

(Supplementary note 7) The cooling system according to any one of supplementary notes 1 to 6, wherein
the condenser includes a fin fixed to an outer wall of the condenser in a thermally contacting manner.

(Supplementary note 8) The cooling system according to any one of supplementary notes 1 to 7, wherein
the gas refrigerant pipe and the liquid refrigerant pipe are refrigerant pipes having flexibility.

(Supplementary note 9) The cooling system according to any one of supplementary notes 1 to 8, wherein
heat insulation processing is applied to at least the liquid refrigerant pipe.

(Supplementary note 10) A device housing apparatus, comprising: a rack for mounting a plurality of electronic devices;
a cooling system according to any one of supplementary notes 1 to 8 provided corresponding to the rack; and
an air blower for taking in outside air and blowing the taken air at the electronic device to cool the electronic device and blowing out the outside air having a temperature risen by the electronic device via the cooling system.

(Supplementary note 11) The cooling system according to supplementary note 10, comprising
a duct enclosing the electronic device and the evaporator.

(Supplementary note 12) The cooling system according to supplementary note 10 or 11, wherein
the cooling medium is cooling water set to a temperature lower than a temperature of a gas refrigerant flowing into the condenser.

(Supplementary note 13) The cooling system according to any one of supplementary notes 10 to 12, wherein a size of the evaporator is formed as a size smaller than the electronic device.

Although the present invention has been described with reference to an exemplary embodiment (and an example) above, the present invention is not limited to the above-mentioned exemplary embodiments (and the examples). Various modifications which a person skilled in the art can understand can be applied in the composition and details of the present invention within the scope of the present invention.

This application claims priority based on Japanese application Japanese Patent Application No. 2011-156852, filed on Jul. 15, 2011, the disclosure of which is incorporated herein in its entirety.

DESCRIPTION OF SYMBOLS

2 Device housing apparatus
2a Front plate
2b Inlet
2c Back plate
2d Rear door
3 Electronic device
4 Air blower
5 Cooling system
6 Chassis
8 Cooling pipe
10 Evaporator
10a Upper part evaporator
10b Lower part evaporator
11 Condenser
11a and 11b Chassis
11b, 11c and 29 Fin
12 Refrigerant pipe
12a Gas refrigerant pipe
12b Liquid refrigerant pipe
13 Duct
20 Upper part header
21 Middle header
22 Lower part header
23a Upper part steam generating tube
23b Lower part steam generating tube
23c Convex portion
30 Bypass pipe
31a First flow path
31b Second flow path
31c Third flow path

The invention claimed is:

1. A cooling system for cooling an electronic device, comprising:
an evaporator for evaporating a refrigerant by performing heat exchange with outside air;
a condenser for condensing a gas refrigerant into a liquid refrigerant by making a refrigerant and a cooling medium perform heat exchange with each other;
a gas refrigerant pipe and a liquid refrigerant pipe connecting the evaporator and the condenser; and
the evaporator including:
an upper part header provided in a highest position of the evaporator, and connected with the condenser by the gas refrigerant pipe, through the gas refrigerant pipe a gas refrigerant flowing;
a lower part header provided in a lowest position of the evaporator, and connected with the condenser by the liquid refrigerant pipe, through the liquid refrigerant pipe a liquid refrigerant flowing;
a middle header provided in an intermediate position between the upper part header and the lower part header, and connected with the condenser by the liquid refrigerant pipe, through the liquid refrigerant pipe the liquid refrigerant flowing;
an upper part evaporator, arranged between the upper part header and the middle header, including an upper part steam generating tube having a first flow path for leading a refrigerant of the middle header to the upper part header while making the refrigerant of the middle header perform heat exchange with outside air and having a second flow path for leading a refrigerant of the lower part header to the upper part header while making the refrigerant of the lower part header perform heat exchange with outside air; and
a lower part evaporator, arranged between the lower part header and the middle header, including a lower part steam generating tube having a third flow path inserted into the middle header while making a refrigerant of the lower part header perform heat exchange with outside air, the lower part steam generating tube being communicated with the second flow path of the upper part steam generating tube.

2. The cooling system according to claim 1, wherein
a convex portion extending along a flow path direction of a refrigerant is formed in a flow path inner wall of at least one of the first flow path, the second flow path and the third flow path.

3. The cooling system according to claim 2, wherein
a fin is fixed to an outer wall of the upper part steam generating tube and the lower part steam generating tube in a thermally contacting manner.

4. The cooling system according to claim 3, wherein
the middle header includes a bypass pipe for making the second flow path of the upper part evaporator and the third flow path of the lower part evaporator communicate with each other.

5. The cooling system according to claim 4, wherein
the bypass pipe is formed in a manner being integrated with the upper part steam generating tube or the lower part steam generating tube.

6. The cooling system according to claim 5, wherein
the condenser includes a fin fixed to an inner wall of the condenser in a thermally contacting manner.

7. The cooling system according to claim 6, wherein
the condenser includes a fin fixed to an outer wall of the condenser in a thermally contacting manner.

8. The cooling system according to claim 7, wherein
the gas refrigerant pipe and the liquid refrigerant pipe are refrigerant pipes having flexibility.

9. A device housing apparatus, comprising:
a rack for mounting a plurality of electronic devices;
a cooling system according to claim 8 provided corresponding to the rack; and
an air blower for taking in outside air and blowing the taken air at the electronic device to cool the electronic device and blowing out the outside air having a temperature risen by the electronic device via the cooling system.

10. The cooling system according to claim 9, comprising
a duct enclosing the electronic device and the evaporator.

11. The cooling system according to claim 8, wherein
heat insulation processing is applied to at least the liquid refrigerant pipe.

12. The cooling system according to claim 10, wherein
the cooling medium is cooling water set to a temperature lower than a temperature of a gas refrigerant flowing into the condenser.

13. The cooling system according to claim 12, wherein
a size of the evaporator is formed as a size smaller than the electronic device.

* * * * *